United States Patent [19]

Bill et al.

[11] Patent Number: 5,059,815
[45] Date of Patent: Oct. 22, 1991

[54] HIGH VOLTAGE CHARGE PUMPS WITH SERIES CAPACITORS

[75] Inventors: Colin S. Bill; Michael A. Van Buskirk, both of San Jose; Antonio J. Montalvo, San Francisco, all of Calif.

[73] Assignee: Advanced Micro Devices, Inc., Sunnyvale, Calif.

[21] Appl. No.: 505,335

[22] Filed: Apr. 5, 1990

[51] Int. Cl.⁵ ................. H03K 17/66; H02J 11/00
[52] U.S. Cl. ................. 307/246; 307/296.2; 363/60
[58] Field of Search ........... 307/296.2, 246, 110; 363/60

[56] References Cited

U.S. PATENT DOCUMENTS

| | | | |
|---|---|---|---|
| 3,490,812 | 2/1974 | Fry | 307/246 |
| 4,028,596 | 6/1977 | Weber | 363/60 |
| 4,311,923 | 1/1982 | Luscher et al. | 307/296.8 |
| 4,667,312 | 5/1987 | Doung et al. | 365/203 |
| 4,839,787 | 6/1989 | Kojima et al. | 363/60 |
| 4,843,258 | 6/1989 | Miyawaki et al. | 307/296.2 |
| 4,922,402 | 5/1990 | Olivo et al. | 363/60 |
| 4,962,512 | 10/1990 | Kiuchi | 363/60 |
| 4,970,409 | 11/1990 | Wada et al. | 363/60 |

OTHER PUBLICATIONS

"Analysis and Design of Digital Integrated Circuits", Hodges et al., McGraw-Hill, pp. 88-91, 1983.

Primary Examiner—Stanley D. Miller
Assistant Examiner—Richard Roseen
Attorney, Agent, or Firm—Skjerven, Morrill, MacPherson, Franklin & Friel

[57] ABSTRACT

A charge pump circuit is provided comprising a MOS capacitor, a capacitor ("series capacitor") connected in series, a MOSFET diode, and a voltage clamp connected to the common node of the MOS capacitor and the series capacitor. A number of these charge pump circuits may be cascaded to form a multi-stage charge pump circuit. Each charge pump circuit may attain output voltage higher than the oxide breakdown voltage of each individual MOS capacitor. This charge pump circuit can also operate under low voltage power supply conditions.

10 Claims, 2 Drawing Sheets

HIGH VOLTAGE CHARGE PUMPS WITH SERIES CAPACITORS

BACKGROUND OF THE INVENTION

1. Field of the Invention

This invention relates to the design of charge pumps, and in particular, to the design of charge pumps in high voltage integrated circuit technology. This invention is also applicable to other integrated technologies where low start-up voltage condition is desired.

2. Description of the Prior Art

Charge pumps are circuit elements using the pumping action of diode connected MOSFETs and MOS capacitors to provide a voltage source of higher voltage than the power supplies The charge pumping effect may be achieved by a MOS capacitor, which is a MOSFET with its source and drain terminals shorted to each other, and with its gate terminal connected to a diode connected MOSFET (known also as a MOSFET diode). A diode connected MOSFET is a MOSFET with its gate and drain terminals shorted to each other. By applying an oscillating voltage to the tied source and drain terminals of the MOS capacitor, a successively higher voltage is induced at the source terminal of the MOSFET diode with time, until a steady state voltage is reached.

FIG. 1a shows a two-stage charge pump circuit in the prior art. As shown in FIG. 1a, and throughout the following description, MOS capacitors (e.g. capacitors 120 and 130) are shown to be n-MOSFETs. The use of n-MOSFET in this description is for the purpose of example only. The skilled person in the art will be able to infer from the following description and the accompanying drawings, corresponding circuits using p-MOSFETs.

In FIG. 1a, the source-drain terminal of MOS capacitor 120 is connected to clock input Φ, the gate terminal of MOS capacitor 120 is connected to node 125, which is connected to the gate and drain terminals of NMOS transitor 110, and the source terminal of NMOS transistor 100. The drain terminal of NMOS transistor 100 is connected to a supply voltage Vpp. The source terminal of NMOS transistor 110 is connected to node 135, which is the gate terminal of MOS capacitor 130. The gate and drain terminals of NMOS transistor 140 are also connected to node 135. The MOS capacitor 130 is driven at it source-drain terminal by clock input φ, which is the non-overlapping complementary signal to clock signal Φ (see FIG. 1b). MOS capacitor 120 and MOSFET diode 110 form the first stage of this charge pump circuit. MOS capacitor 130 and MOSFET diode 140 form the second, and, in this implementation, the output stage of the charge pump circuit. The source terminal of NMOS transistor 140 is tapped as the output terminal $V_{out}$ of this charge pump circuit.

Initially, through NMOS transistors 160 and 100, node 125 is precharged to within the supply voltage VCC less the threshold voltages (Vt) of NMOS transistors 160 and 100.

FIG. 1b the non-overlapping and complementary waveforms of clock inputs Φ and φ. When clock input φ is low, MOS capacitor 120 is on. As clock input Φ goes high, node 125 is capacitively coupled to a voltage equal its precharge voltage plus the clock swing of clock input Φ, with some loss due to the parasitic capacitance at node 125. This turns on MOSFET diode 110 which charges up node 135. When clock input Φ goes low, node 125 follows, thus turning off transistor 110. Immediately thereafter, clock input Φ goes high which increases the voltage at node 135 by the voltage swing of clock input Φ times a capacitive coupling ratio. The charging of node 135 turns on MOSFET 140 which charges up $V_{out}$.

Node 125 is precharged to a higher voltage with each successive clock cycle. The maximum output voltage $V_{out}$ of a stage in the pump is equal to the maximum precharge voltage Vpp plus the clock voltage $V_\Phi$ times the coupling ratio K less the Vt of the diode connected MOSFET. Thus, the maximum output voltage of this implementation is:

$$V_{out}^{max} = V_{pp} + 2(KV_\Phi - V_t)$$

where $$K = \frac{C_{120}}{C_{120} + C_{STRAY,\,125}} = \frac{C_{130}}{C_{130} + C_{STRAY,\,135}};$$

$C_{120}$ and $C_{130}$ are the capacitances of MOS capacitors 120 and 130 respectively; $C_{STRAY,\,125}$ and $C_{STRAY,\,135}$ are the parasitic capacitances at nodes 125 and 135 respectively.

A requirement for the initialization of the pumping action is that MOS capacitor 120 must be on; that is, its gate voltage at node 125 must exceed its threshold voltage (Vt). The voltage at node 125 is initially the voltage power supply VCC, less the two threshold voltage drops at transistors 100 and 160. This voltage at node 125 must be greater than the threshold voltage (approximately 0.7 volts) of MOS capacitor 120. Hence, the supply voltage VCC must not fall below 2.1 volts in the worst case.

FIG. 2 shows an application of a charge pump circuit. In FIG. 2, a charge pump circuit 220 is used to modulate node 270 to keep node 260 at constant voltage despite varying current requirements of current source 240 drawing time-varying current $I_{out}$. Voltage $V_{260}$ at node 260 is held to $$V_{260} = V_{ref}\left(1 + \frac{R1}{R2}\right)$$

If node 260 falls too low due to increased current demand, the comparator will enable oscillator 210 and pump the gate terminal of transistor 250 higher, so that transistor 250 can supply the required current at its source terminal 260 to maintain node 260 at the required voltage $V_{260}$.

In general, the voltage Vmax attainable by an n-stage charge pump is given by:

$$V_{max} = V_{pp} + n(aV - V_t)$$

where:

Vt is the threshold voltage of the MOSFET diode;
Vpp is the supply voltage;
V is the voltage swing in the clock input signal Φ;
n is the number of stages in the charge pump; and
a is the fraction of the capacitance at the gate terminal of the MOS capacitor to the total capacitance of the capacitor gate node, which includes the parasitic capacitance of the MOSFET diode (such as MOSFET diodes 110 & 140). This fraction is typically less than 1.

The charge pump mechanism may be limited, however, if the desired highest voltage is beyond the oxide breakdown voltage of the MOS capacitor. This is because the voltage difference built up across the gate and drain-source terminals of MOS capacitor 120 or 130 may be large enough to exceed the breakdown voltage of the thin gate oxide in the MOS capacitor before the desirable output voltage is reached. In integrated circuit designs, it is generally desirable to have a thin gate oxide. Therefore, the goal of achieving highest voltage in the charge pump circuit is in conflict with the generally desirable goal of having thin gate oxides. In one application, the desirable voltage to be achieved in the charge pump circuit is 17 volts, but the thin oxide breakdown voltage is around 13 volts. In the prior art, voltage clamping circuit elements are used to avoid breakdown by limiting the voltage drop across the gate and source-drain of the MOS capacitor. While breakdown of the MOS capacitor is avoided by the voltage clamp, the output of the charge pump circuit remains limited by the oxide breakdown voltage of the MOS capacitor.

Therefore, it is an object of the current invention to provide a charge pump circuit capable of attaining a higher voltage output than the oxide breakdown voltage across the gate and source-drain terminals of the MOSFET capacitor.

SUMMARY OF THE INVENTION

By providing in a charge pump circuit a capacitor connected in series with each MOS capacitor, an output voltage higher than the individual thin oxide breakdown voltage of the MOS capacitor is achieved.

By providing also a voltage clamp at the junction of the series capacitor and the MOS capacitor, the initial voltage in the gate terminal of the MOS capacitor is preset, thereby ensuring start-up of the charge pump. Furthermore, this voltage clamp reduces the minimum voltage VCC necessary to start the charge pump. This clamp also ensures proper distribution of the voltage across the capacitors in the presence of junction leakage.

BRIEF DESCRIPTION OF THE DRAWINGS

FIG. 1b shows the complementary clock inputs $\Phi$ and $\overline{\Phi}$ used in the charge pump circuit of FIG. 1a.

DETAILED DESCRIPTION

One example of a charge pump capable of delivering an output voltage higher than the breakdown voltage of the pumping MOSFET capacitor is described in the copending application entitled "Back-to-Back Capacitor Charge Pumps" by Antonio J. Montalvo, Ser. No. 07/505,292, filed April 5, 1990, now U.S. Pat. No. 5,008,799, issued April 16, 1991, assigned to Advanced Micro Devices, Inc., also the Assignee of this patent, is hereby incorporated by reference in its entirety. The apparatus described therein is especially suitable when parallel-plate capacitors may not be readily formed from overlapping traces of interconnect material. Otherwise, the present invention may be used. In general, both the apparatus described hereinbelow in accordance with the present invention and the apparatus described therein in the above-mentioned copending application are applicable to provide the high output voltage, noise immunity, and low supply voltage operation advantages of the present invention.

n-MOSFETs are used in the following description and claims for illustrative purpose only. Unless specifically called for, p-MOSFET may be used wherever an MOS transistor is shown. Of course, the necessary modifications to the embodiments described herein will be obvious to a person of ordinary skill in the art, when substituting p-MOSFETs for n-MOSFETs.

Figure 3:
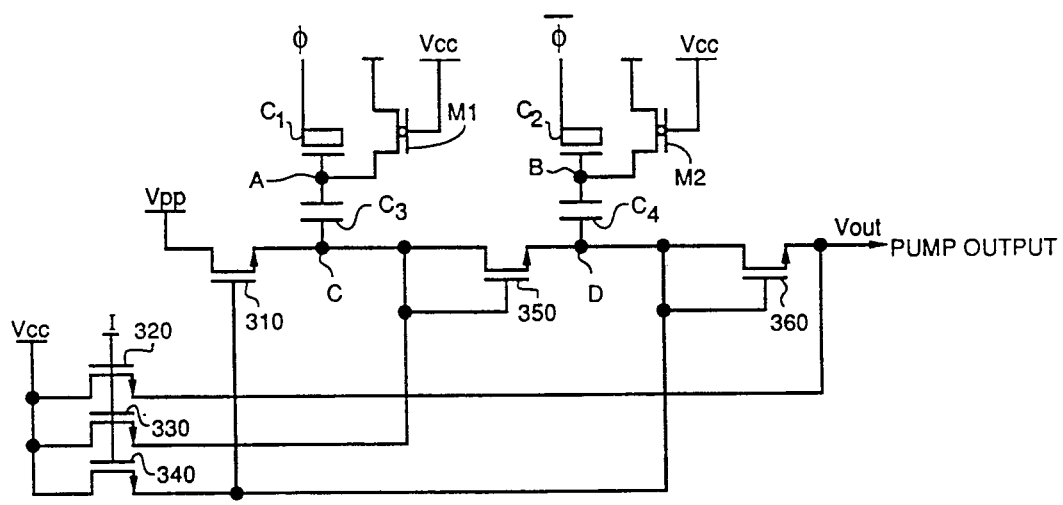
FIG. 3 shows an embodiment of the present invention using capacitors C3 and C4 connected in series with MOS capacitors C1 and C2 respectively.

FIG. 3 shows an embodiment of the present invention in a two-stage charge pump. The present invention does not restrict, nor is it limited by, the number of stages in the circuit. Stages can be cascaded or eliminated dependent on the output voltage desired. In general, the output voltage attainable is increased by having more stages in the charge pump. Each stage comprises a pumping MOSFET capacitor connected in series to another capacitor (hereinafter referred to as the "series capacitor"), a voltage clamp and a MOSFET diode. The voltage clamp controls the common node between the pumping capacitor and the series capacitor, and output is tapped at the terminal of the series capacitor not connected to the voltage clamp, and transmitted to the next stage by the MOSFET diode.

As shown in FIG. 3, the first stage of this two-stage charge pump is formed by pumping MOS capacitor C1, series capacitor C3, voltage clamp M1, and MOSFET diode 350. The second stage is formed by pumping MOS capacitor C2, series capacitor C4, voltage clamp M2, and MOSFET diode 360. The voltage output of the first stage is taken at node labeled "D", and the voltage output of the second stage is taken at node labeled "$V_{out}$".

Pumping MOS capacitors C1 and C2 are connected to the clock inputs $\Phi$ and $\overline{\Phi}$ respectively. In this embodiment, for illustration purpose only, these MOS capacitors are enhancement mode capacitors; depletion mode MOSFET capacitors may also be used. The gate terminals of pumping MOS capacitors C1 and C2 are connected in series respectively to series capacitors C3 and C4 at nodes labeled "A" and "B." The other terminals of capacitors C3 and C4 are connected to the nodes C and D respectively.

The capacitors C3 and C4 may be formed from any capacitor, including a parallel plate capacitor. For example, such a capacitor may be formed from two independent layers of polysilicon separated by a dielectric layer, such as an oxide. Polysilicon capacitors are formed from overlapping traces of polysilicon defined by different mask levels. Polysilicon traces are often used as interconnect material for connecting devices in an integrated circuit.

MOSFETs M1 and M2 are present for the purpose of initiating nodes A and B respectively at the start of pumping. Also, they provide a minimum voltage for the nodes A and B, when the voltages at these nodes drop because of a small leakage from nodes A and B. MOSFETs M1 and M2 thereby constrain the maximum voltage across the MOS and series capacitors in the first and second stages respectively.

Figure 1A:
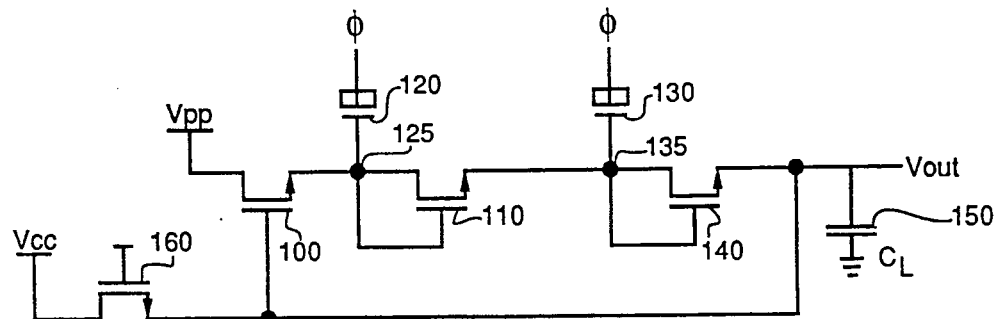
FIG. 1a shows a prior art charge pump circuit using two MOS capacitors 120 and 130, and MOSFET diodes 110 and 140.

For transistors M1 and M2 to act as voltage clamps for nodes A and B, enhancement or intrinsic mode transistors are preferred. Depletion mode transistors could be used in conjunction with a reference signal. Because of the voltage clamps M1 and M2, the minimum voltages at nodes A and B are at the supply voltage VCC, less the threshold associated voltage of the voltage clamp transistor M1 or M2. If M1 and M2 are intrinsic transistors, then their threshold voltages Vti are around 0.1 volt. To ensure MOS capacitor C1 to be in the ON state at the onset of charge pumping, supply voltage VCC need only be maintained such that the drop across MOS capacitor C1 is greater than C1's threshold voltage, i.e., $(VCC - Vti) > Vt$, or about 0.8 volts, as compared to 2.1 volts in the prior art. Hence, the present invention is more tolerant to power supply fluctuation than the prior art circuit shown in FIG. 1a.

The output nodes D and $V_{out}$ of the two charge pump stages are the source terminals of diode connected MOSFETs 350 and 360 respectively The gate terminal of transistor 350 is connected to node C and also to the source terminal of transistor 330, whose drain and gate terminals are connected to the power supply VCC. Supply voltage VCC in this embodiment is about 5 volts. Likewise, the output node $V_{out}$ of the second stage, in this two-stage charge pump circuit is the source terminal of diode connected MOSFET 360, whose gate and drain terminals are connected to node D, and also to the source terminal of transistor 340. Transistor 340's gate and drain terminals are connected to the power supply VCC.

Node C is also connected to the source terminal of transistor 310, whose drain terminal is connected to a supply voltage Vpp. Supply voltage Vpp in this embodiment is about 13 volts. The gate terminal of transistor 310 is connected to the source terminal of transistor 340.

The output node Vout is also connected to the source of transistor 320 whose gate and drain terminals are tied to VCC.

Initially, the nodes C and D are each at the supply voltage VCC, less the threshold voltages of transistors 330 and 340 respectively. The nodes A and B are also each at supply voltage VCC, less the respective threshold voltage of intrinsic transistors M1 or M2 $(VA = VCC - Vti)$. At this voltage, both pumping MOS capacitors C1 and C2 are in the ON state.

Figure 1B:
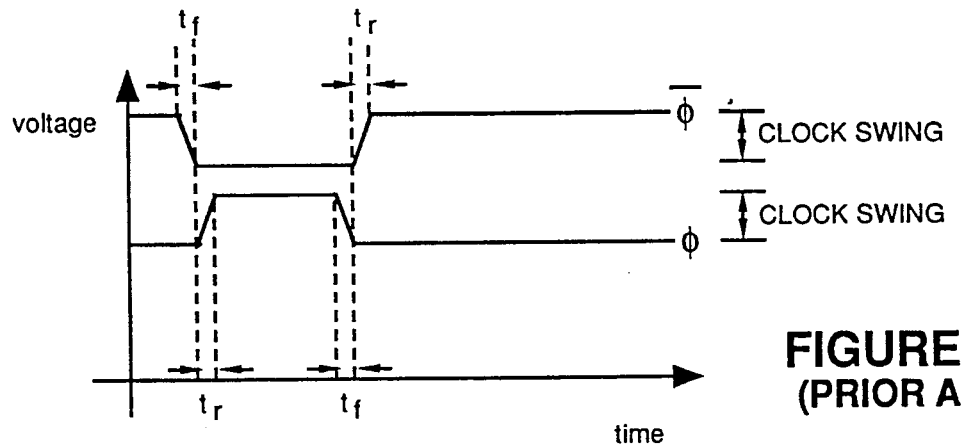
Figure 2:
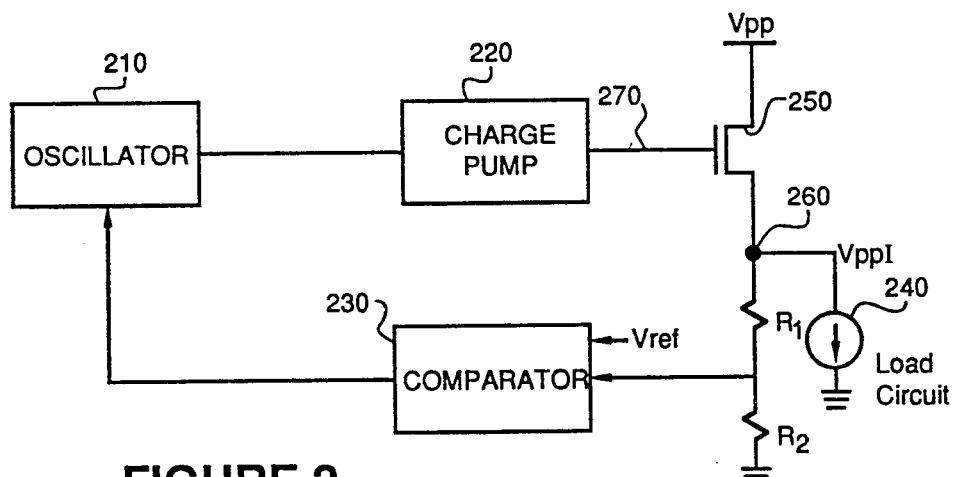
FIG. 2 shows an application of a charge pump circuit.

The clock inputs Φ and 101 have voltage waveforms as shown in FIG. 1b. After each pulse of clock input Φ at the source-drain of pumping MOS capacitors C1, and similarly at C2 ($\overline{\Phi}$), as previously described in conjunction with FIG. 1a, an increase in voltage results in each of nodes C and D. Unlike the circuit shown in FIG. 1a, however, this increase in voltage at, for example, node C is distributed between the MOS capacitor C1 and the series capacitor C3, in the ratio of their capacitances, hence, the voltages of nodes A and C rise towards their maximum as pumping action continues. Because of the reverse biased source junction of transistor M1, leakage of charge from node A to substrate, will result in the voltage at node A reaching a minimum of $VCC - Vti$ over time. Likewise, the pumping action at MOS capacitor C2 increases the voltage at B and D, with a consequent leak of the voltage at B to $(VCC - Vti)$ over time.

The voltage across node C and the source-drain (i.e. clock input) of pumping MOS capacitor C1 at any time during the pumping period may be higher than the oxide breakdown voltage of either MOS capacitor C1 or the series capacitor C3. However, because of the voltage distribution at the MOS capacitor C1 and the series capacitor C3, the voltage across node A and the source-drain terminal at MOS capacitor C1 does not exceed the oxide breakdown voltage of the MOS capacitor C1. A typical value for the MOS capacitor C1 is 0.96pf and for the series capacitor C3 is 0.78pf. Also, after leakage from node A, the final voltage across series capacitor C3 does not exceed its oxide breakdown voltage either. Hence, the object of providing a charge pump capable of a voltage output higher than the oxide breakdown voltage of charge pumping MOS capacitor is achieved.

The above detailed description is intended to be exemplary only and not limiting. A person skilled in the art will be able, in consideration of the above description and the accompanying drawings, to suggest modifications and variations within the scope of the present invention.

We claim:

1. A charge pump apparatus comprising:
   charge pumping means having an input lead and an output lead, for providing an increase in voltage on said output lead in response to a signal received on said input lead;
   a capacitor having first and second leads, said first lead of said capacitor connected to said output lead of said charge pumping means, such that said increase in voltage in said output lead of said charge pumping means is distributed between said output lead of said charge pumping means and said second lead of said capacitor;
   diode means having input and output leads, said input lead of said diode means connected to said second lead of said capacitor, for transferring said increase in voltage from said input lead of said diode means to said output lead of said diode means; and
   voltage clamp means connected to said output lead of said charge pumping means, for ensuring that voltage on said output lead of said charging means does not fall below a minimum predetermined voltage.

2. A charge pump apparatus as in claim 1, wherein said charge pumping means comprises an MOS capacitor having gate, source and drain terminals, said gate terminal being said output lead of said charge pumping means, and said source and drain terminals connected together to form said input lead of said charge pumping means.

3. A charge pump apparatus as in claim 1, wherein said voltage clamp means comprises a transistor having gate, source and drain terminals, said drain terminal connectable to a power supply and said gate terminal, said source terminal connected to said output lead of said charge pumping means, thereby providing a minimum voltage to said charge pumping means.

4. A charge pump apparatus as in claim 1, wherein said diode means comprises a transistor having gate, source and drain terminals, said gate terminal connected to said drain terminal.

5. A charge pump apparatus as in claim 1, wherein said charge pumping means comprises an MOS capacitor having gate, source and drain terminals, said gate terminal of said MOS capacitor being said output lead of said charge pumping means, and said source and drain terminals of said MOS capacitor connected together to form said input of said charge pumping means, and wherein said voltage clamp means comprises a transistor having gate, source and drain terminals, said drain terminal of said transistor connectable to a power supply and said gate terminal of said transistor, said source terminal of said transistor connected to said output lead of said charge pumping means, and said power supply need only having voltage higher or equal to the sum of the threshold voltage of said MOS capacitor and the threshold voltage of said transistor.

6. A charge pump apparatus comprising a plurality of charge pumping elements each charge pumping element having an output lead, said charge pump apparatus formed by cascading said plurality of charge pumping elements, each charge pumping element comprising:

charge pumping means having an input lead and an output lead, for providing an increase in voltage on said output lead in response to a signal received on said input lead;

a capacitor having first and second leads, said first lead of said capacitor connected to said output lead of said charge pumping means, such that said increase in voltage in said output lead of said charge pumping means is distributed between said output lead of said charge pumping means and said second lead of said capacitor;

diode means having input and output leads, said input lead of said diode means connected to said second lead of said capacitor, for transferring said increase in voltage from said input lead of said diode means to said output lead of said diode means, said input lead of said diode means being said input lead of said charge pumping element, said output lead of said diode means being said output lead of said charge pumping element; and voltage clamp means connected to said output lead of said charge pumping means, for ensuring that voltage on said output lead of said charging means does not fall below a minimum predetermined voltage.

7. A charge pump apparatus as in claim 6, wherein each of said charge pumping means comprises an MOS capacitor having gate source and drain terminals, said gate terminal being said output lead of said charge pumping means, and said source and drain terminals connected together to form said input lead of said charge pumping means.

8. A charge pump apparatus as in claim 6, wherein each of said voltage clamp means comprises a transistor having gate, source and drain terminals, drain terminal connectable to a power supply and said gate terminal, said source terminal connected to said output lead of said charge pumping means, thereby providing a minimum voltage to said charge pumping means.

9. A charge pump apparatus as in claim 6, wherein each of said diode means comprises a transistor having a gate, source and drain terminals, said drain terminal being said input lead of said diode means, said source terminal being said output lead of said diode means, and said gate terminal connected to said drain terminal.

10. A charge pump apparatus as in claim 6, wherein each charge pumping means comprises an MOS capacitor having gate, source and drain terminals, said gate terminal of said MOS capacitor being said output lead of said charge pumping means, and said source and drain terminals of said MOS capacitor connected together to form said input lead of said charge pumping means, and wherein each voltage clamp means comprises a transistor having gate, source and drain terminals, said drain terminal of said transistor connectable to a power supply and said gate terminal of said transistor, said source terminal of said transistor connected to said output lead of said charge pumping means, and said power supply need only having voltage higher or equal to the sum of the threshold voltage of said MOS capacitor and the threshold voltage of said transistor.

* * * * *

UNITED STATES PATENT AND TRADEMARK OFFICE
CERTIFICATE OF CORRECTION

PATENT NO.    : 5,059,815
DATED         : October 22, 1991
INVENTOR(S)   : Colin Stewart Bill; Michael A. Van Buskirk, and Antonio J. Montalvo It is certified that error appears in the above-identified patent and that said Letters Patent is hereby corrected as shown below:

Col. 1, line 62, "$\phi$ and $\phi$" should read --$\phi$ and $\overline{\phi}$--.

Col. 2, line 2, "$\phi$" should read --$\overline{\phi}$--.

Col. 2, line 4, "$\phi$" should read --$\overline{\phi}$--.

Col. 3, line 50, "$\phi$" should read --$\overline{\phi}$--.

Col. 4, line 40, "$\phi$ and $\phi$" should read --$\phi$ and $\overline{\phi}$--.

Col. 5, line 45 delete "101 and insert --$\overline{\phi}$--.

Col. 5, line 48 delete "($\phi$)" and insert --$\overline{\phi}$--.

Signed and Sealed this

Thirtieth Day of November, 1993

Attest:

BRUCE LEHMAN

Attesting Officer

Commissioner of Patents and Trademarks